(12) United States Patent
El-Kik

(10) Patent No.: US 6,278,302 B1
(45) Date of Patent: Aug. 21, 2001

(54) DIGITAL POWER-UP RESET CIRCUIT

(75) Inventor: Tony S. El-Kik, Allentown, PA (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/324,922

(22) Filed: Jun. 3, 1999

(51) Int. Cl.[7] .................................................. H03L 7/00
(52) U.S. Cl. .......................................... 327/143; 327/198
(58) Field of Search ................................... 327/141–143, 327/198; 377/64, 66, 67, 69; 364/717.03, 718.04

(56) References Cited

U.S. PATENT DOCUMENTS

| | | | | |
|---|---|---|---|---|
| 5,105,376 | * | 4/1992 | Pedron | 364/717 |
| 5,625,825 | * | 4/1997 | Rostoker et al. | 395/730 |
| 5,790,626 | * | 8/1998 | Johnson et al. | 377/69 |
| 5,867,409 | * | 2/1999 | Nozuyama | 364/717.03 |
| 5,993,055 | * | 11/1999 | Williams | 371/22.4 |
| 6,014,446 | * | 1/2000 | Finkelstein | 380/46 |

* cited by examiner

Primary Examiner—My-Trang Nu Ton
(74) Attorney, Agent, or Firm—William H. Bollman

(57) ABSTRACT

A digital power-up reset circuit is disclosed which provides a pulse of a predetermined width after a period of time after power-up. Because the power-up circuit is digital, it can be easily implemented in an integrated circuit. Moreover, it is relatively invariable to differences in manufacturing processes from device to device, in contrast to conventional analog (e.g., RC time constant based) power-up reset circuits, which have widely varied output pulses from device to device, and which are highly susceptible to variances in output pulse width due to changes in ambient temperature. The digital power-up reset circuit includes a first linear feedback shift register which starts up in an arbitrary state, and a second linear feedback shift register which defines a desired length of an activation of an output reset signal. When the first linear feedback shift register reaches a known state based on a first counter, the second linear feedback shift register is reset and activates a reset pulse until a second counter reaches a second known state.

17 Claims, 3 Drawing Sheets

DIGITAL POWER-ON-RESET CIRCUITRY

DIGITAL POWER-ON-RESET CIRCUITRY

CONVENTIONAL POWER-ON-RESET CIRCUIT

DIGITAL POWER-UP RESET CIRCUIT

BACKGROUND OF THE INVENTION

1. Field of the Invention

The present invention relates generally to an architecture for a power-up reset circuit. More particularly, it relates to an all-digital power-up circuit having advantageous properties, such as an output reset pulse having a predictable width in the face of variances in manufacturing processes, ambient temperature, etc.

2. Background of Related Art

Power-up or power-on reset circuits are generally used to provide a digital reset pulse to circuitry (e.g., processors) when power is first applied to a system and becomes stable. Depending upon the impedance of a particular system and/or the output drive of a particular power supply, power-up reset signal pulses are generally initiated within 1 or so seconds of initial power-up.

Most conventional power-on reset circuits are designed using analog, passive components such as a resistor, a capacitor, and a one shot pulse generator such as a Schmitt-trigger gate. The resistor and capacitor provide a slowly rising voltage level, which at a predetermined level triggers a pulse to be output,from the Schmitt-trigger gate.

In many applications, the conventional analog power-on reset works suitably well. However, a problem arises when it is desired to generate a power-on reset pulse having a specific width. The width of the conventional power-on reset pulse depends heavily on the values of the resistor and the capacitor. Moreover, the width of the output reset pulse varies in response to changes in other parameters as well. For instance, the width of the output reset pulse is subject to, e.g., variations due to process parameters and/or changes in the ambient temperature.

A conventional power-up reset circuit is shown in FIG. 3.

In particular, in FIG. 3, an analog power-up reset circuit includes a resistor 302 and a capacitor 304 in series between power VDD, and ground GND. The node 320 between the resistor 302 and the capacitor 304 is input into an appropriate Schmitt-trigger 306. The output reset pulse RESETN 310 is input to appropriate hardware devices, e.g., ASIC Device 308.

When initially powered-up, the power node VDD rises substantially immediately in voltage from ground level to its powered level, e.g., 5 volts. However, the node 320 is filtered by the resistor 302/capacitor 304 combination, and thus relatively slowly rises in voltage level from ground level to VDD. Once the voltage level at the node 320 rises beyond a predetermined threshold level of an input of said Schmitt-trigger 306, a reset pulse RESETN 310 is output from the Schmitt-trigger 306.

The conventional power-up reset circuit, e.g., as shown in FIG. 3, works well in circuit simulations, particularly when under the assumption that the device supply voltage VDD rises quickly to its powered, maximum level (e.g., 5 volts), and stays there without any glitches. With a proper selection of the appropriate resistor-capacitor (RC) time constant with a proper choice of resistor and capacitor values, the Schmitt-trigger 306 will initially hold the system in reset with a de-active (e.g., LOW logic level) reset pulse RESETN 310, then provide just one reset pulse.

Unfortunately, a conventional power-up reset circuit has two particular problems. Firstly, the width of the output reset pulse RESETN 310 varies with variances in power supplies, e.g., having different power-up rise times. Moreover, the width of the output reset pulse RESETN 310 also varies because of variances in process parameters from device to device during a manufacturing run, requiring looser design standards. Furthermore, changes in the ambient temperature may cause corresponding changes in the RC time constant formed by the resistor 302 and capacitor 304 as well as characteristics of the Schmitt-trigger device 306. Secondly, power interruptions will typically cause the supply voltage to correspondingly drop to O V for short periods of time, causing the internal states of flip-flop latches inside the ASIC device 308 to become unstable, but typically not sufficient enough to cause the RC filter 302, 304 to discharge to cause the output reset pulse RESETN 310 to stay inactive. Consequently, the conventional analog-based power-up reset circuit may occasionally loose track of its own internal states, causing instabilities in the electronic system.

There is a need for an improved power-up reset circuit which outputs a reset pulse having a predictable width which does not vary significantly from device to device in a manufacturing production run, and/or which does not vary significantly due to changes in ambient temperature.

SUMMARY OF THE INVENTION

In accordance with the principles of the present invention, a power-up reset circuit comprises a first shift register to count toward a known state after power-up, and a second shift register, reset by the known state of the first shift register, to count a length of activation of an output reset pulse.

A method of resetting a digital circuit in accordance with another aspect of the present invention comprises clocking a first shift register with digital logic for an arbitrary number of cycles of a clock after the digital logic is powered up. A second shift register is reset once the first shift register has shifted for the arbitrary number of cycles of the clock. A reset signal is activated for a predetermined number of cycles of the clock, and deactivated after the predetermined number of cycles of the clock have elapsed.

BRIEF DESCRIPTION OF THE DRAWINGS

Features and advantages of the present invention will become apparent to those skilled in the art from the following description with reference to the drawings, in which.

DETAILED DESCRIPTION OF ILLUSTRATIVE EMBODIMENTS

The present invention provides an all-digital or substantially all-digital hardware power-up reset circuit having an output pulse of predictable width. The digital power-up reset circuit is particularly useful for resetting digital and/or processing devices, and may be implemented on an integrated circuit device either with the device being reset or external thereto.

Upon power-up of a system including the digital power-up reset circuit, the digital power-up reset circuit begins operation and ultimately outputs one reset pulse for a known number of clock cycles.

The digital power-up circuit is based on the use of two linear-feedback shift registers together with some control logic. The first linear feedback shift register provides a delay before the reset pulse is activated, e.g., active low as shown in the disclosed embodiments. The larger the first linear feedback shift register (i.e., the more bits), the greater the probability that the digital power-up reset circuit will function properly.

Figure 1:
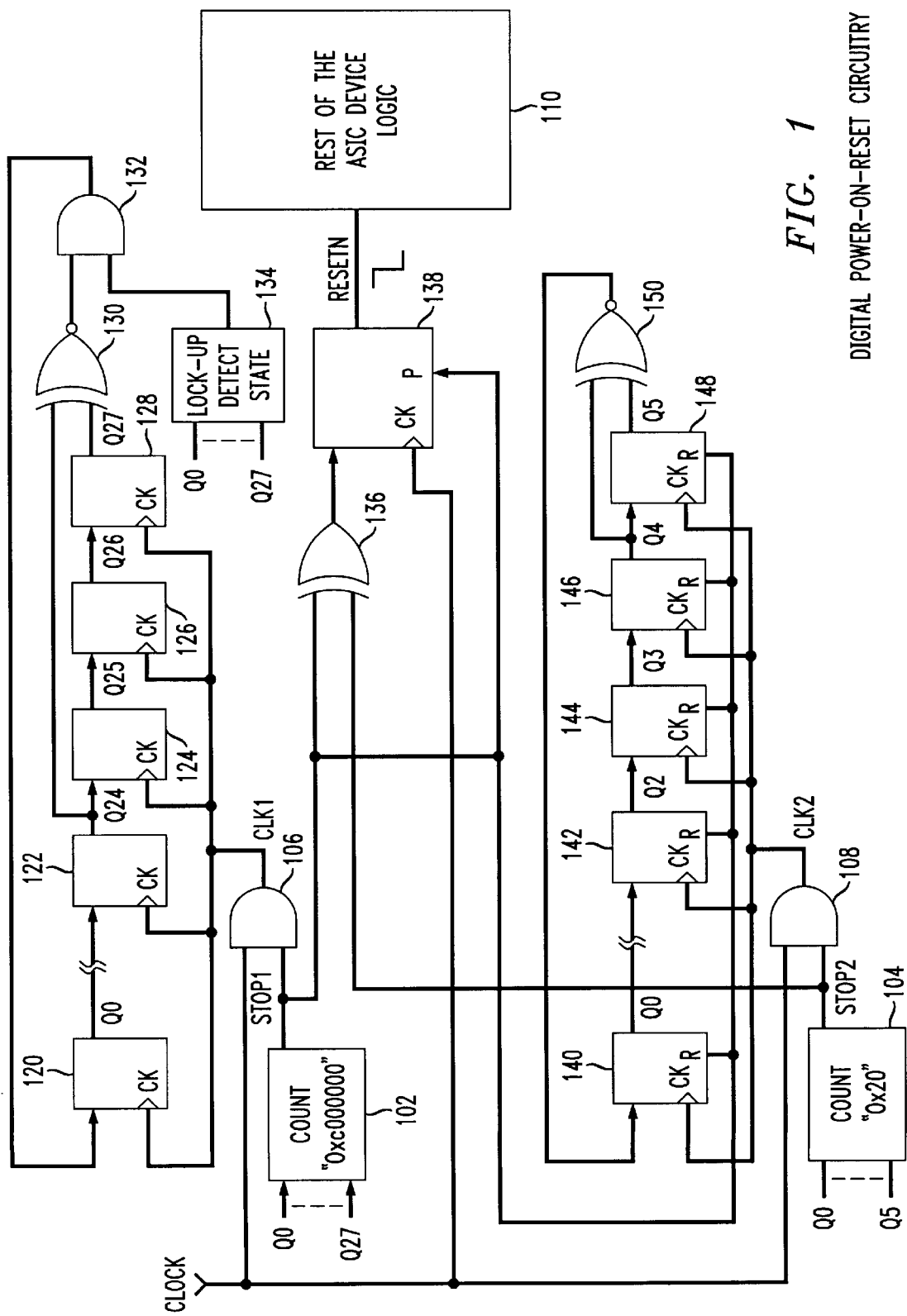
FIG. 1 shows an embodiment of an all-digital power-up reset circuit using two Linear-feedback shift registers and some control logic, in accordance with the principles of the present invention.

FIG. 1 shows an exemplary embodiment of a digital power-up or power-on reset circuit using two Linear-feedback shift registers together with some control logic in accordance with the principles of the present invention.

In particular, in FIG. 1, a first linear feedback shift register is formed by a plurality of flip-flops 120–128. Although only five flip-flops are shown, the disclosed embodiment includes twenty-eight (28) flip-flops in the first linear feedback shift register. In accordance with the principles of the present invention, the first linear feedback shift register may comprise any number of flip-flops. The number of flip-flops in the first linear feedback shift register is determined based on a desired probability of an operable start-up condition of the digital power-up reset circuit upon power-up. In the disclosed embodiment, a twenty-eight (28) bit linear feedback shift register (LFSR) is used, to provide a maximum of ($2^{28}$ −1) possible power-up states. For instance, in the disclosed example, taps for bits 27 and 24 (flip-flops 128 and 122) were used as the inputs to an exclusive NOR (XNOR) feedback gate 130. The output of the XNOR gate 130 is ANDed with a lock-up detector 134 which tests for a lock-up condition of the digital power-up reset circuit using an AND gate 132. The output of the AND gate 132 is fed back to the input of the first flip-flop 120 in the first linear feedback shift register.

For the digital power-up reset circuit to function properly when powered up, the first (e.g., 28-bit) LFSR must power up in any state except "0 xC000000". The probability of this happening is $1/(2^{28} - 1)$ or $3.73 \times 10^{-9}$. If all states are 1's, the circuit will function properly because the possibility of a lock-up condition has been eliminated.

To further improve the probability of the digital power-up reset circuit functioning correctly, the number of bits (i.e., flip-flops) in the first linear feedback shift register can be increased. For instance, the number of flip-flops in the first linear feedback shift register can be increased from, e.g., twenty-eight (28) to, e.g., thirty-nine (39). Thirty-nine (39) flip-flops provides improved probability of a malfunction (i.e., lock-up condition upon power-up) to $1.82 \times 10^{-12}$.

Thus, the more flip-flops comprised in the first linear feedback shift register, the greater the probability of an operable (i.e., non-locked up) start. Those of ordinary skill in the art will appreciate that any length LFSR can be used within the principles of the present invention. The first linear feedback shift register is clocked with the output from an AND gate 106, which ANDs a system clock signal CLOCK together with a counter which outputs an active signal at a predetermined or known state, e.g., when equal to "0xC000000".

A second linear feedback shift register is formed by a second plurality of flip-flops 140–148. The number of flip-flops in the second linear feedback shift register defines the length of the activation of the reset pulse output from the digital power-up reset circuit. For instance, the disclosed embodiment of FIG. 1 shows the use of six (6) flip-flops, corresponding to an active reset pulse width of sixty-four (64) clock cycles.

In the disclosed example, taps for the last two bits of the second linear feedback shift register, i.e., from flip-flops 146 and 148, are input to an exclusive NOR (XNOR) feedback gate 150. The output of the XNOR gate 150 is fed back to the input of the first flip-flop 140 in the second linear feedback shift register.

The second linear feedback shift register is clocked with the output from an AND gate 108, which ANDs a system clock signal CLOCK together with a counter which outputs an active signal at a predetermined or known state, e.g., when equal to "0x20".

The width of the output active reset pulse is adjusted by design choice in the use of taps of the second LFSR. Of course, those of ordinary skill in the art will appreciate that any length second LFSR can be used within the principles of the present invention.

The outputs of the two counters 102 and 104 are input to an XNOR gate 136, which in turn outputs a data signal to an output flip-flop 138. The output flip-flop 138 is clocked by the system clock. The output flip-flop 138 eliminates any glitches on the output of the second LFSR.

The output reset signal from the output flip-flop 138 is active low, but of course an active high reset signal may be alternatively or additionally output from the flip-flop 138 (or from an intervening logic circuit) in accordance with the principles of the present invention.

The lock-up detect module 134 overcomes the occurrence of a potential lock-up condition which might otherwise occur when all states in the first linear feedback shift register are all "1(i.e., all in a logic HIGH state). By ANDing the output of the XNOR feedback gate 130 with the decoded signal of the lock-up state output from the lock-up detect module 134, a "0" or logic LOW is forced to be shifted into the first flip-flop 120 of the first LFSR.

Upon power up, the output STOP1 from the first counter 102 is a "1" or logic HIGH, which maintains the 6-bit second LFSR in a reset mode. However, once the count of the 28-bit first LFSR reaches the value of, e.g., "0xC0000000" (decimal "201326592"), the output signal STOP1 goes to a logic LOW or "0", disabling the clock signal to the 28-bit first LFSR, and then the 6-bit second LFSR is activated.

When the 6-bit second LFSR is activated, the output reset signal RESETN provided to the devices being reset, e.g., to the ASIC device logic 110, is activated with a "0". When the count of the 6-bit second LFSR reaches the value of, e.g., "0x20" or decimal "32 "64 clock cycles later, the output signal STOP2 from the second counter 104 becomes a logic LOW or "0", disabling the clock signal to the 6-bit second LFSR, and forcing the deactivation of the output reset signal RESETN, e.g., to a non-active "1" or logic HIGH. This guarantees that the circuitry being reset, e.g., the ASIC device 110, will receive a power-up reset pulse of exactly the desired width, e.g., 64 clock cycles.

If the digital power-up reset circuit looses its supply power, the clock signals to both the first (e.g., 28-bit) and second (e.g., 6-bit) LFSRs will be released, and the output power-up reset signal RESETN will be generated again, thus allowing the internal states of the devices being reset (e.g., ASIC device 110) to be reinitialized properly.

Figure 2:
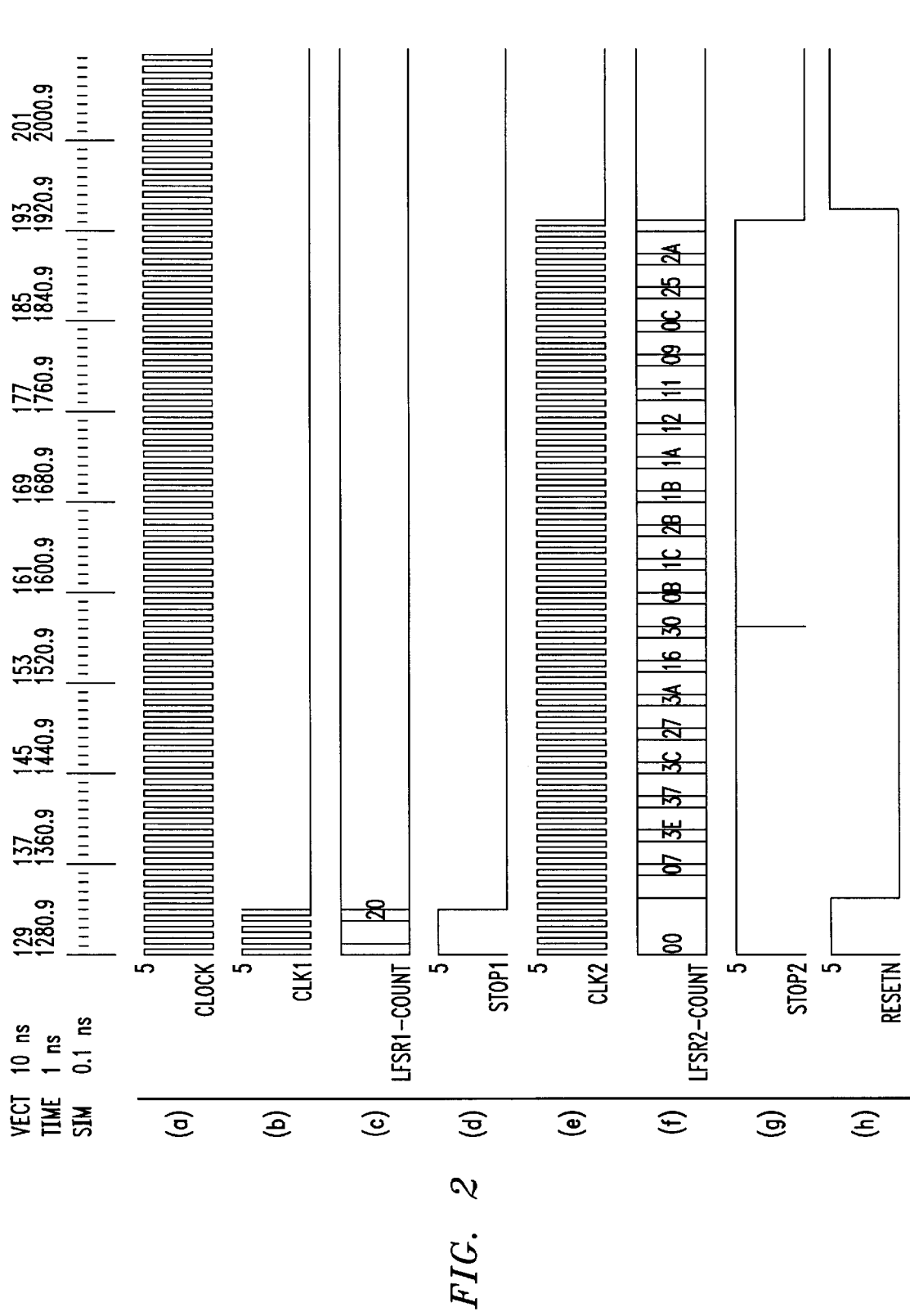
FIG. 2 shows results of a simulation useful for explaining the operation of the digital power-up reset circuit shown in FIG. 1.
Figure 3:
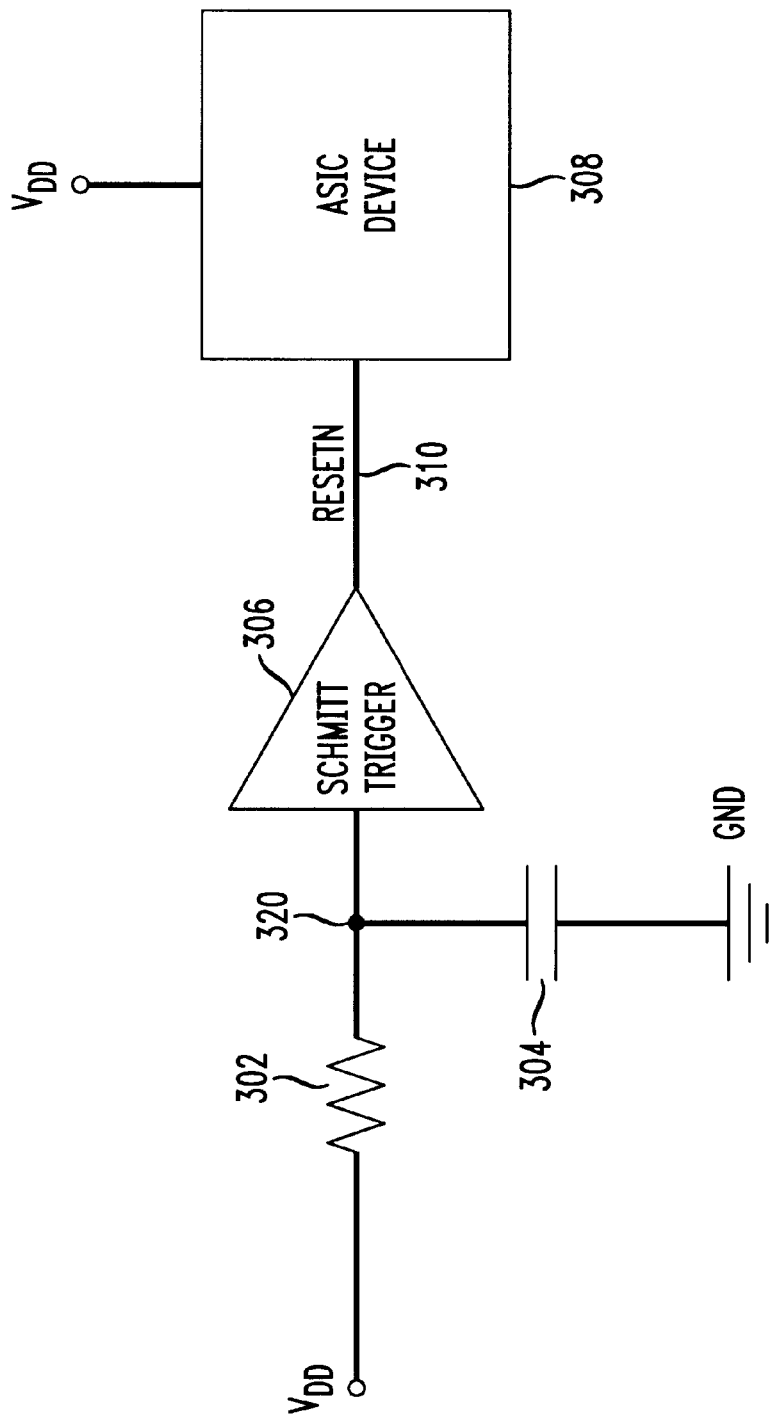
FIG. 3 shows a conventional analog-based power-up reset circuit.

FIG. 2 shows the result of simulation of the digital power-up reset circuit shown in FIG. 1. For ease and speed of simulation and explanation, the simulation was based on the first LFSR comprising only 7 flip-flops (instead of the twenty-eight (28) as shown in FIG. 1). However, those of ordinary skill in the art will appreciate that the simulation results relate equally to the digital reset power-up circuit as shown in FIG. 1.

In FIG. 2, note that the first LFSR stops at count 0x40 and the second LFSR starts counting up to 0x10.

Waveform (a) of FIG. 2 shows the system clock signal CLOCK as shown in FIG. 1.

Waveform (b) of FIG. 2 shows the output of the AND gate 106 shown in FIG. 1.

Waveform (c) of FIG. 2 represents the state of the count in the first counter 102. Waveform (d) of FIG. 2 shows the output signal STOP1 of the first counter 102.

Waveform (e) of FIG. 2 shows the output of the AND gate 108 shown in FIG. 1.

Waveform (f) of FIG. 2 represents the state of the count in the second counter 104.

Waveform (g) of FIG. 2 shows the output signal STOP2 of the second counter 104.

Waveform (h) of FIG. 2 shows the resulting active low output power-up reset signal RESETN provided to the circuitry being reset, e.g., to the ASIC device 110 shown in FIG. 1.

While the invention has been described with reference to the exemplary embodiments thereof, those skilled in the art will be able to make various modifications to the described embodiments of the invention without departing from the true spirit and scope of the invention.

What is claimed is:

1. A power-up reset circuit, comprising:
   a first shift register to count toward a known state after power-up; and
   a second shift register, activated by said known state of said first shift register, to count a length of activation of an output reset pulse.

2. The power-up reset circuit according to claim 1, wherein:
   said first shift register is a linear feedback shift register.

3. The power-up reset circuit according to claim 2, wherein:
   said second shift register is a linear feedback shift register.

4. The power-up reset circuit according to claim 1, wherein:
   said second shift register is a linear feedback shift register.

5. The power-up reset circuit according to claim 1, further comprising:
   a first counter to allow a clock signal to clock said first shift register until said known state is achieved.

6. The power-up reset circuit according to claim 5, further comprising:
   a second counter to allow said clock signal to clock said second shift register for said length of activation of said output reset pulse.

7. The power-up reset circuit according to claim 1, wherein:
   said first shift register is greater than 10 bits in length.

8. The power-up reset circuit according to claim 1, wherein:
   said first shift register is greater than 20 bits in length.

9. The power-up reset circuit according to claim 1, wherein:
   said first shift register is at least 28 bits in length.

10. A method of resetting a digital circuit, comprising:
    clocking a first shift register with digital logic for a predetermined number of cycles of a clock after said digital logic is powered up;
    activating a second shift register once said first shift register has shifted for said predetermined number of cycles of said clock, to count a length of activation of an output reset pulse; and
    deactivating said reset signal after said predetermined number of cycles of said clock have elapsed.

11. The method of resetting said digital circuit according to claim 10, further comprising, substantially before said clocking of said first shift register:
    deactivating said reset signal.

12. The method of resetting said digital circuit according to claim 10, wherein:
    said reset signal is active low.

13. The method of resetting said digital circuit according to claim 10, wherein:
    said reset signal is active high.

14. Apparatus for resetting a digital circuit, comprising:
    means for clocking a first shift register with digital logic for a predetermined number of cycles of a clock after said digital logic is powered up;
    means for activating a second shift register once said first shift register has shifted for said predetermined number of cycles of said clock, to count a length of activation of an output reset pulse; and
    means for deactivating said reset signal after said predetermined number of cycles of said clock have elapsed.

15. The apparatus for resetting said digital circuit according to claim 14, further comprising:
    means for deactivating said reset signal substantially before said clocking of said first shift register.

16. The apparatus for resetting said digital circuit according to claim 14, wherein:
    said reset signal is active low.

17. The apparatus for resetting said digital circuit according to claim 14, wherein:
    said reset signal is active high.

* * * * *